(12) United States Patent
Hsiao et al.

(10) Patent No.: US 8,373,269 B1
(45) Date of Patent: Feb. 12, 2013

(54) JIGS WITH CONTROLLED SPACING FOR BONDING DIES ONTO PACKAGE SUBSTRATES

(75) Inventors: Yi-Li Hsiao, Hsin-Chu (TW); Chen-Hua Yu, Hsin-Chu (TW); Chung-Shi Liu, Hsin-Chu (TW); Chien Ling Hwang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 13/227,969

(22) Filed: Sep. 8, 2011

(51) Int. Cl.
*H01L 23/34* (2006.01)
*H01L 21/50* (2006.01)
*H01L 21/48* (2006.01)
*H01L 21/44* (2006.01)

(52) U.S. Cl. ........ 257/727; 257/726; 438/106; 438/110; 438/113

(58) Field of Classification Search .................. 257/726, 257/727; 438/106, 110, 113
See application file for complete search history.

(56) References Cited

U.S. PATENT DOCUMENTS

| 6,596,561 B2 * | 7/2003 | Takahashi et al. ............ 438/113 |
| 7,033,857 B2 * | 4/2006 | Munakata et al. ............ 438/106 |
| 2007/0072313 A1 * | 3/2007 | Yamada et al. ................. 438/14 |

* cited by examiner

*Primary Examiner* — Luan C Thai
(74) *Attorney, Agent, or Firm* — Slater & Matsil, L.L.P.

(57) ABSTRACT

A device includes a lower jig and an upper jig, wherein the lower jig and the upper jig are configured to secure a package substrate. The lower jig includes a first base material and a first plurality of features attached to the first base material. The first plurality of features is disposed adjacent to a peripheral of the lower jig. The upper jig includes a second base material and a second plurality of features attached to the second base material. The second plurality of features is disposed adjacent to a peripheral of the upper jig. The first plurality of features is configured to be attracted to the second plurality of features by a magnetic force.

20 Claims, 7 Drawing Sheets

JIGS WITH CONTROLLED SPACING FOR BONDING DIES ONTO PACKAGE SUBSTRATES

BACKGROUND

In the packaging of integrated circuits, dies may be packaged onto a package substrate (sometimes referred to as a laminate substrate), which includes metal connections that may route electrical signals between opposite sides of the laminate substrate. The dies may be bonded onto one side of a laminate substrate using flip chip bonding, and a reflow is performed to melt the solder bumps that interconnect the dies and the laminate substrate.

The laminate substrates may use materials that can be easily laminated. These materials, however, are prone to the warpage caused by the elevated temperature during the reflow of the solder bumps. The warpage may cause irregular joints and/or bump cracks, and lead to poor assembly yield. Conventionally, to reduce the warpage of a laminate substrate, jigs may be used to press the laminate substrate from both sides. The jigs may include a lower jig and an upper jig. The upper jig typically has a grid pattern with openings therein, and the laminate substrate is sandwiched between the lower jug and the upper jig. Portions of the laminate substrate are exposed through the openings in the upper jig. Dies are bonded to the laminate substrate through the openings.

The jigs, however, also introduce problems. For example, the laminate substrates typically have coefficients of thermal expansion (CTEs) different from the CTEs of the jigs. Therefore, although the laminate substrates are smooth before the reflow, during the reflow process of the bonding, the elevated temperature causes the laminate substrates and the jigs to have different expansion lengths. Although precaution may be taken to reduce the warpage of the laminate substrates during the reflow, the warpage may still occur after the reflow.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Jigs that allow a laminate substrate secured there between to expand and contract in reflow processes are provided in accordance with embodiments. The variations of the embodiments are discussed. Throughout the various views and illustrative embodiments, like reference numbers are used to designate like elements.

Figure 1A:
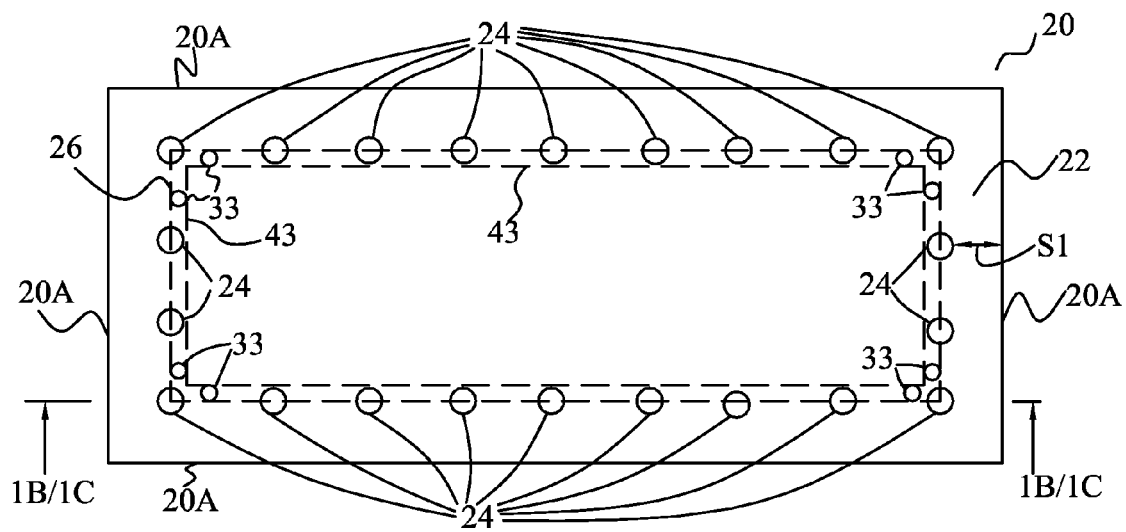
FIGS. 1A through 5 are cross-sectional views and top views of intermediate stages in the bonding of dies onto a package substrate in accordance with various embodiments, wherein the package substrate is disposed between an upper jig and a lower jig.

FIG. 1A illustrates a schematic top view of lower jig 20. In an exemplary embodiment, lower jig 20 comprises base material 22 that is formed of a dielectric material, a metal, or the like. Lower jig 20 may have a rectangular shape, although other shapes may also be used. Lower jig 20 may comprise a plurality of features 24, which may be magnets, and hence is referred to as magnets 24 hereinafter. In an embodiment, magnets 24 are disposed adjacent to the peripheral of lower jig 20, and may be aligned to ring 26, which is adjacent to the peripheral of lower jig 20. Magnets 24 may be disposed adjacent to edges 20A of lower jig 20, with spacing S1 between magnets 24 and a respective nearest edge 20A being smaller than about 2 mm, or smaller than about 1 mm, for example. In an embodiment, substantially no magnet 24 is disposed inside ring 26. Guide pins 33 may be attached as parts of lower jig 20, and protrude out of surface 22A (FIGS. 1B and 1C) of lower jig 20. In some embodiments, the inner edge of guide pins 33 facing the center of lower jig 20 are aligned to the inner edge of magnets 24, wherein the inner edges are illustrated as 47 in FIG. 1A. In other embodiments, the inner edges of guide pins 33 are closer to the center of lower jig 20 than the inner edge of magnets 24.

Figure 1B:
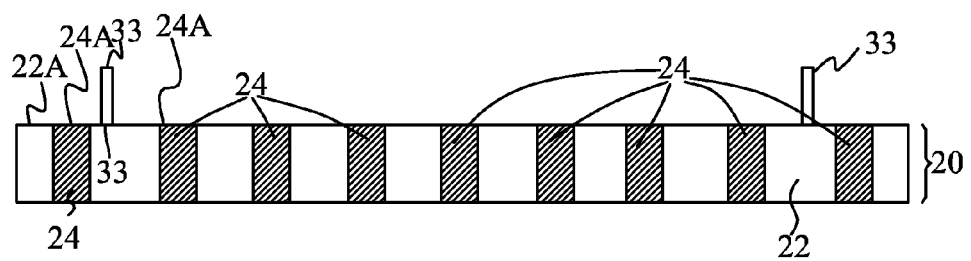
Figure 1C:
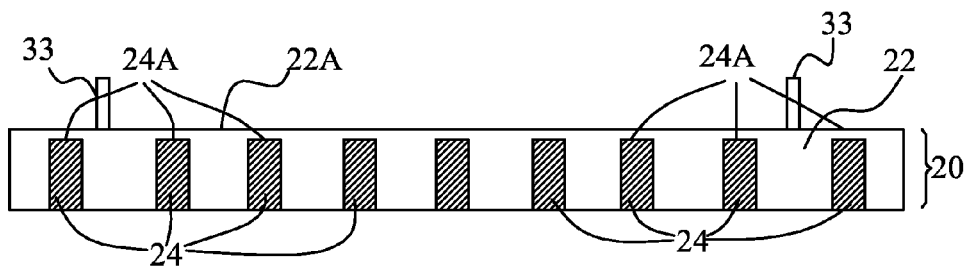

FIGS. 1B and 1C illustrate cross-sectional views of lower jig 20 in accordance with various embodiments, wherein the cross-sectional views are obtained from the plane crossing line 1B/1C-1B/1C in FIG. 1A. In an embodiment, magnets 24 are placed in base material 22. Top surfaces 24A of magnets 24 may be level with, higher than, or lower than, top surface 22A of base material 22. Referring to FIG. 1B, magnets 24 may be exposed through base material 22. Alternatively, as shown in FIG. 1C, top surfaces 24A of magnets 24 may be covered by a layer of base material 22, and are lower than top surface 22A of base material 22.

Figure 2A:
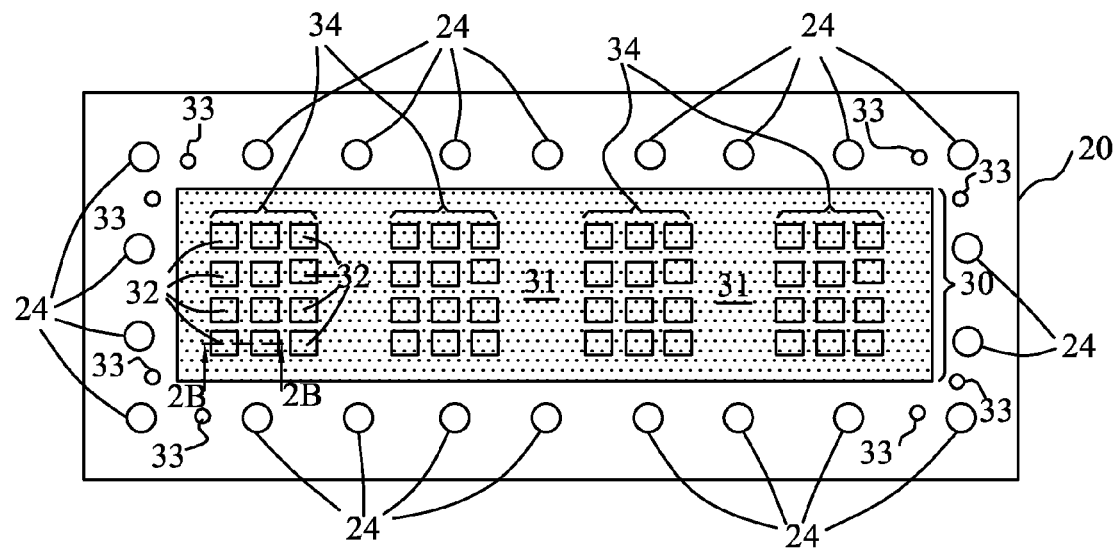
Figure 2B:
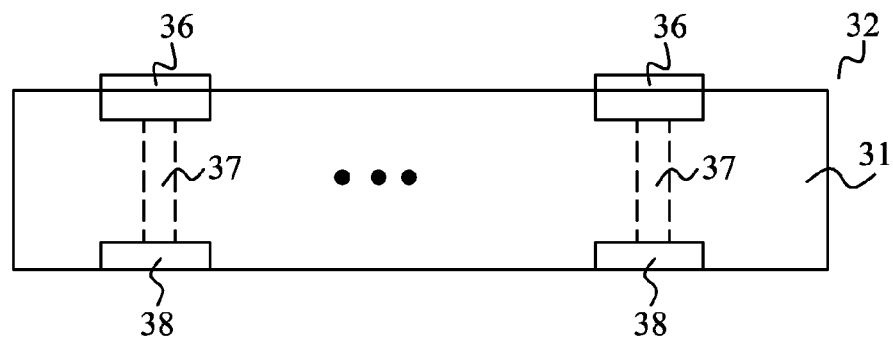

Referring to FIG. 2A, package substrate 30 is placed on the top of lower jig 20. In an embodiment, package substrate 30 comprises dielectric material 31, with metal lines and vias 37 (not shown in FIG. 2A, please refer to FIG. 2B) built inside dielectric material 31. Package substrate 30 may be a laminate substrate, wherein dielectric material 31, which may be formed as dielectric layers, in package substrate 30 are laminate films that are laminated to each other. Package substrate 30 includes a plurality of die-attach regions 32, wherein the structures of die-attach regions 32 are identical to each other. Die-attach regions 32 may be disposed as a plurality of groups 34, with the inter-group spacing between groups 34 greater than the inner-group spacing between die-attach regions 32 that are in the same group. FIG. 2B illustrates a cross-sectional view of one of die-attach regions 32, wherein the cross-sectional view is obtained from the plane crossing line 2B-2B in FIG. 2A. A plurality of metal features 36, which may be pre-solder layers, solder bumps, or non-reflowable metal bumps, are formed on a side of package substrate 30. Metal features 36 are electrically coupled to metal features, such as bond pads 38, on the opposite side of package substrate 30. Dashed lines 37 represent the electrical coupling, which may include a plurality of metal lines and vias interconnecting the metal lines.

Figure 3A:
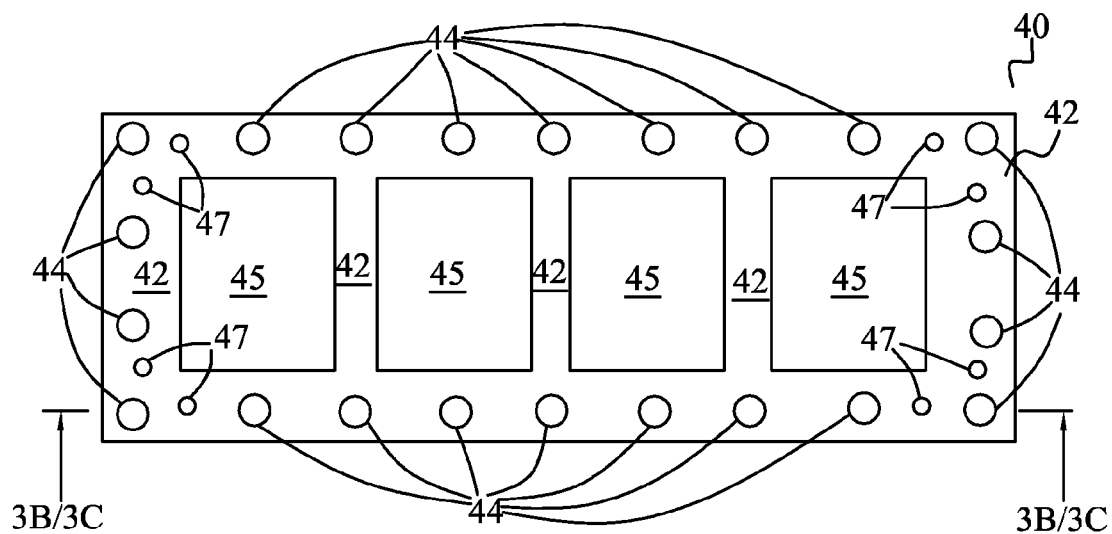

FIG. 3A illustrates a top view of upper jig 40 in accordance with some embodiments. Throughout the description, lower jig 20 and upper jig 40 in combination are referred to as a jig set. In an exemplary embodiment, base material 42 of upper jig 40 may be formed of a dielectric material, a metal, or the like. Upper jig 40 may have a rectangular shape, and may have substantially the same size as lower jig 20. Upper jig 40 may include a plurality of openings 45. The size of each of openings 45 may be great enough to allow one of groups 34 (FIG. 2A) to expose through. Upper jig 40 may comprise a plurality of spacers 44. Spacers 44 have permeability, so that spacers 44 may be attracted to magnets 24. Spacers 44 may be formed of a ferromagnetic material, which may comprise iron, steel, or the like. Upper jig 40 further includes guide pin holes 47 for inserting guide pins 33 that are in lower jig 20 (FIGS. 1A, 1B, and 1C), wherein the positions of guide pin holes 47 are aligned to the positions of guide pins 33.

Figure 3B:
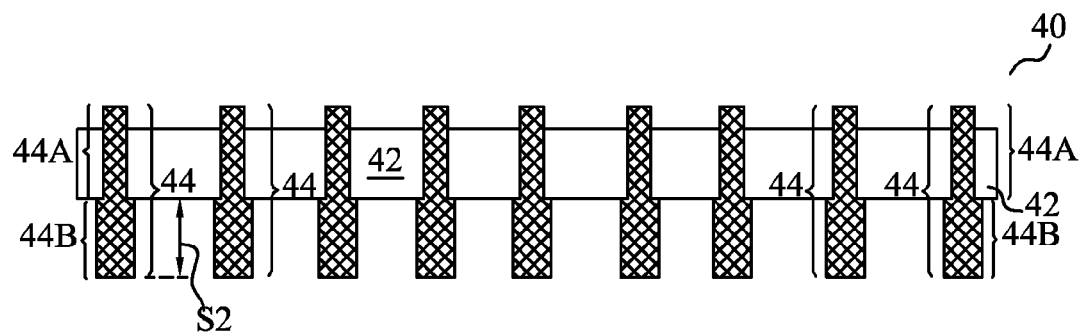
Figure 3C:
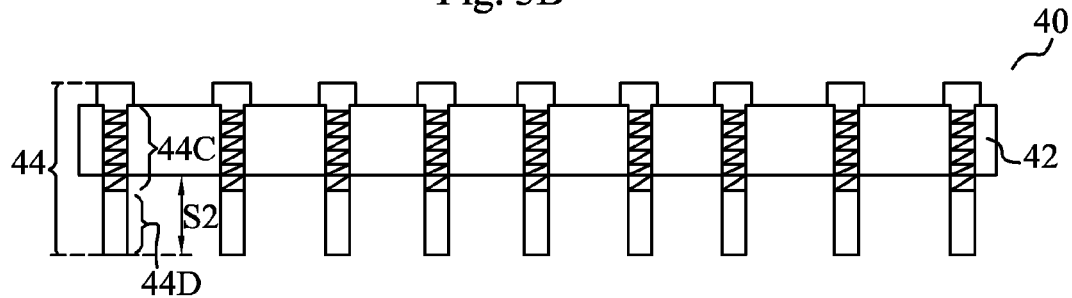

FIGS. 3B and 3C illustrate cross-sectional views of upper jig 40, wherein the cross-sectional views are obtained from the plane crossing line 3B/3C-3B/3C in FIG. 3A. In an embodiment as shown in FIG. 3B, spacers 44 comprises pin portions 44A, which can be inserted through the openings (occupied by pin portions 44A) in upper jig 40, and stopper portions 44B, which have lateral dimensions greater than lateral dimensions of portions 44A and the lateral dimensions of the openings in upper jig 40. Accordingly, spacers 44 may be inserted from the bottom of base material 42 of upper jig 40, with stopper portions 44B being blocked by base material 42. Although not shown, spacers 44 may, or may not, include additional stoppers that are located over base material 42, so that spacers 44 are secured on base material 42 from both sides. Alternatively, an adhesive material may be used to secure spacers 44 on base material 42. Spacers 44 and base material 42 may be attached tightly to form an integrated unit.

Referring to FIG. 3C, in alternative embodiments, spacers 44 may optionally comprise screw portions 44C, and optionally non-screw portions 44D. Screw portions 44C include threads, and the rotation of spacers 44 causes spacers 44 to move in and out of base material 42, and length S2 of the portions of spacers 44 changes correspondingly. Accordingly, screw portions 44C may be used to increase or reduce the distance S2 between base material 22 and base material 40A (FIG. 4B).

The materials and the locations of spacers 44 and features 24 may be arranged differently in any combination, providing spacers 44 and features 24 may function to secure package substrate 30 and to space base materials 22 and 42 apart from each other. For example, in above-discussed embodiments, magnets 24 are formed in lower jig 20, and ferromagnetic spacers 44 are formed in upper jig 40. In alternative embodiments, features 24 may be formed of a ferromagnetic material, while spacers 44 are magnets. In yet other embodiments, both features 24 and 44 are magnets that can be attracted to each other. In addition, spacers 44 may be formed as parts of lower jig 20 rather than parts of upper jig 40, while features 24 are formed as parts of upper jig 40 rather than parts of lower jig 20.

Figure 3D:
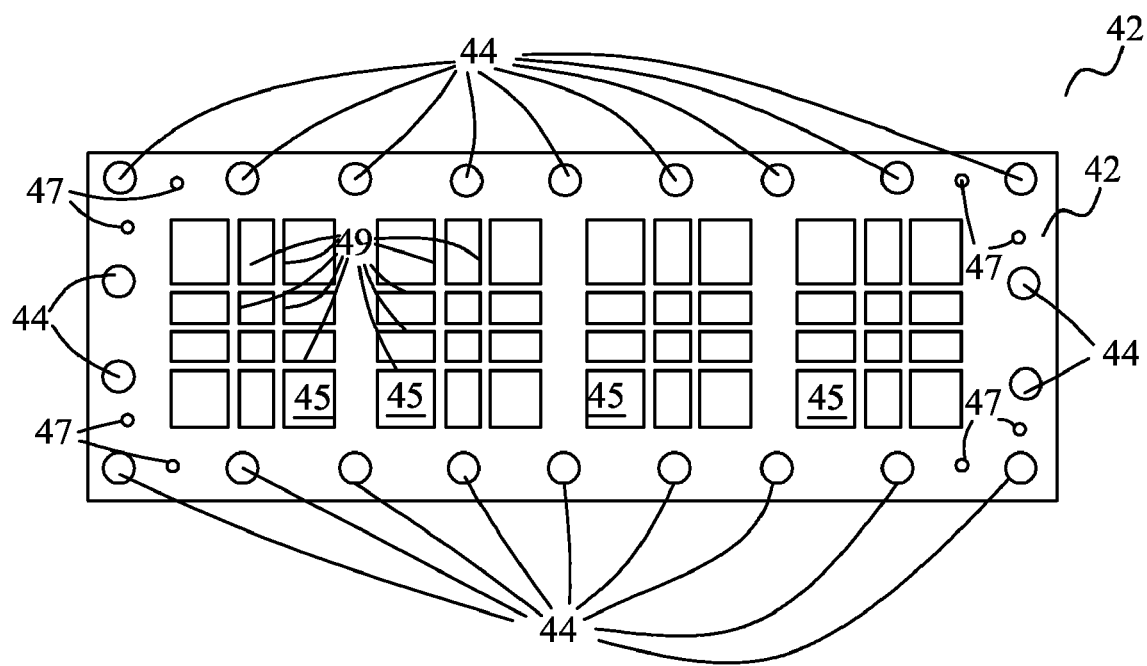

FIG. 3D illustrates mesh-type upper jig 40. The upper jig 40 in accordance with this embodiment is similar to the embodiment shown in FIG. 3A, except meshes 49, which may be formed of the same material as base material 42, are disposed in openings 45. When upper jig 40 is stacked on lower jig 20, die-attach regions 32 may be disposed in the openings formed between meshes 49 and base material 42.

Figure 3E:
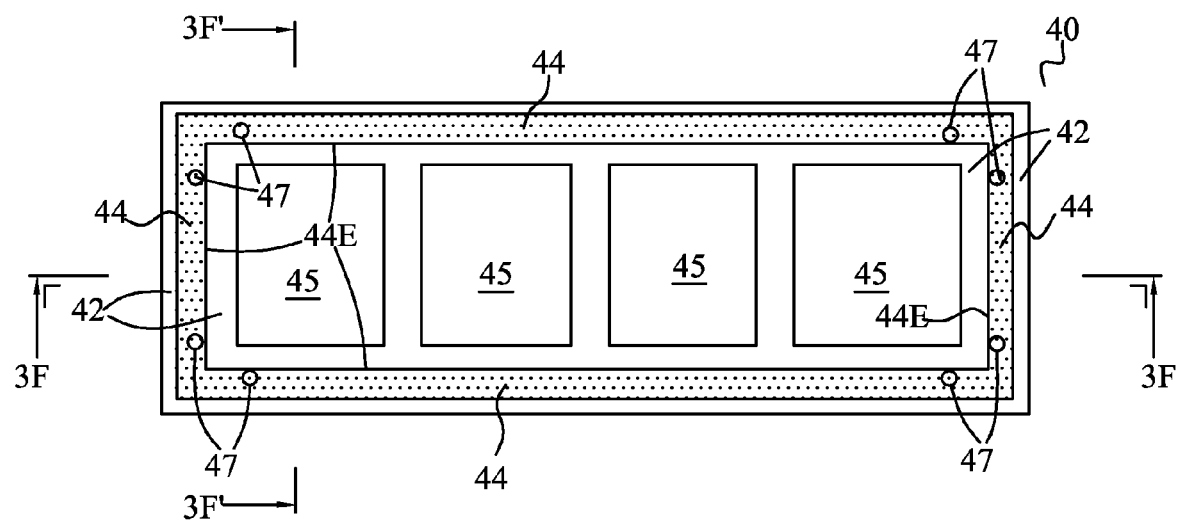
Figure 3F:
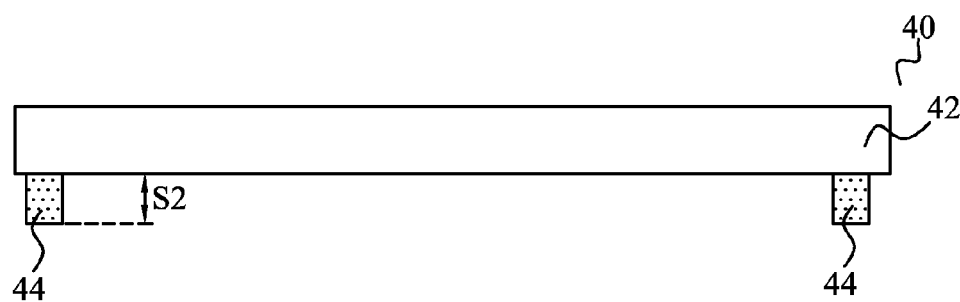

FIG. 3E illustrates a bottom view of upper jig 40 in accordance with alternative embodiments. These embodiments are similar to the embodiments in FIGS. 3A through 3C, except that spacers 44 are formed as strips, rather than small pieces. Strip spacers 44 may be interconnected to form a ring. Alternatively, strips 44 may be disconnected from each other. The material of strip spacers 44 may be essentially the same as the material of spacers 44 shown in FIGS. 3A through 3C. As in the top view shown in FIG. 3E, guide pin holes 47 are on the outer side of the inner edges 44E of spacers 44. The spacer enclosure to guide pin holes 47 may keep spacer 44 away from package substrate 30 when package substrate 30 is placed between upper jig 40 and lower jig 20 (FIG. 4B), so that adequate space may be left for package substrate 30 to expand. FIG. 3F illustrates a cross sectional view of upper jig 40, wherein the cross-sectional view is obtained from the plane crossing line 3F-3F or 3F'-3F' in FIG. 3E. It is noted that spacers 44 may be removable and replaceable, so that spacers 44 having different thicknesses may be replaced to suit to package substrates that have different thicknesses.

Figure 4A:
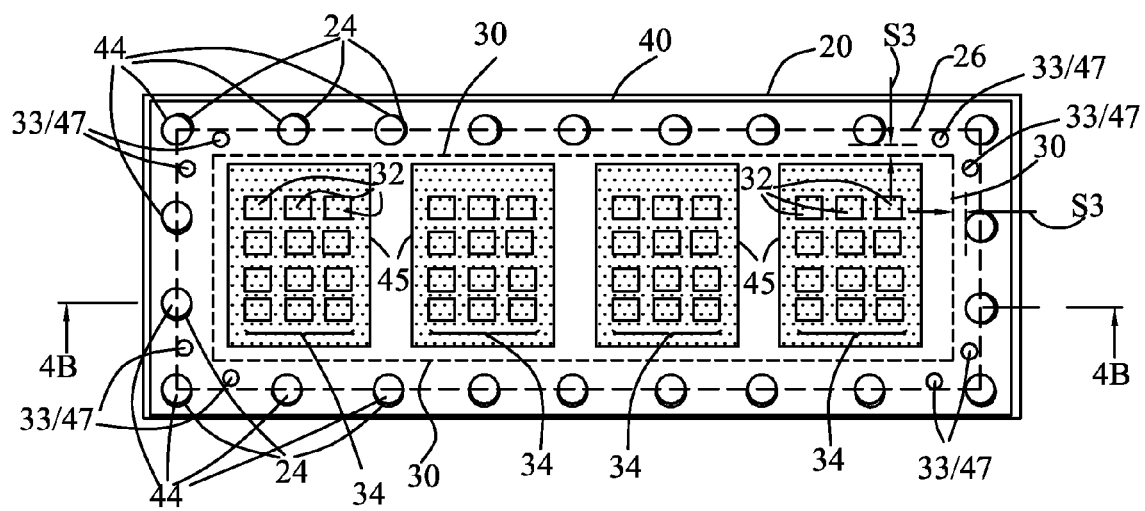
Figure 4B:
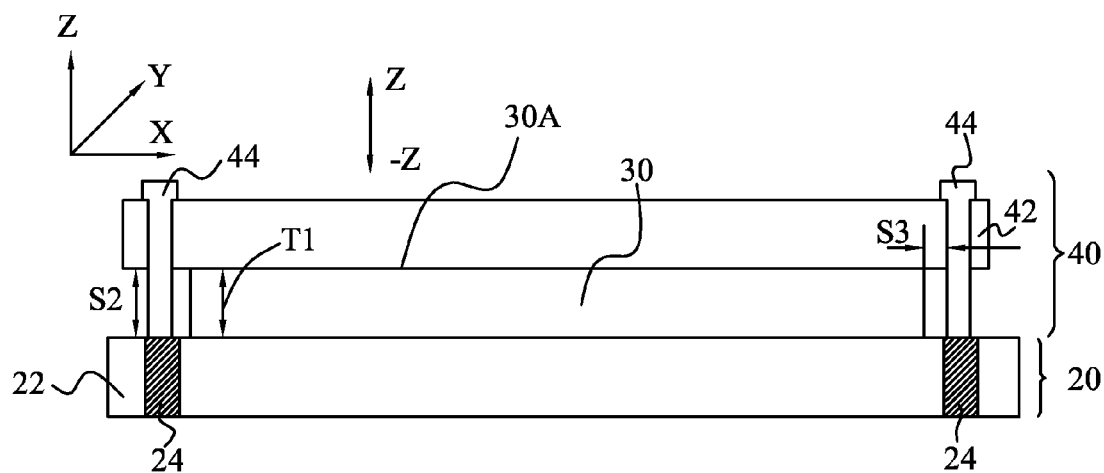

Referring to FIG. 4A, upper jig 40 is placed over the structure shown in FIG. 2A, which includes package substrate 30 and lower jig 20. Guide pins 33 in lower jig 20 are inserted into the corresponding ones of upper jig 40, so that lower jig 20 and upper jig 40 are aligned. Groups 34 of die-attach regions 32 are exposed through openings 45 in upper jig 40. In an embodiment, spacers 44 are substantially vertically aligned to respective magnets 24 (also refer to FIG. 4B) in a one-to-one correspondence, and are attracted to magnets 24. Accordingly, the magnetic force between spacers 44 and magnets 24 is also the force for attaching upper jig 40 to lower jig 20, and for secure package substrate 30 between upper jig 40 and lower jig 20. It is observed that in the top view as in FIG. 4A, spacers 44 and magnets 24 are aligned to ring 26, which encircles package substrate 30. There are non-zero spacings S3 between the sides of ring 26 and the nearest edges of package substrate 30. The non-zero spacings S3 allow package substrate to expand in the subsequent reflow process. In an embodiment, spacings S3 are greater than about 250 µm.

FIG. 4B illustrates a cross-sectional view of the structure shown in FIG. 4A, wherein the cross-sectional view is obtained from the plane crossing line 4B-4B in FIG. 4A. Base material 22 of lower jig 20 and base material of upper jig 40 are spaced apart from each other by spacing S2, which is determined by the length of the portions of spacers 44 that are between base materials 22 and 42 (please also refer to FIG. 3C). Thickness T1 of package substrate 30 may be substantially equal to, and may be slightly greater than, spacing S2. In the embodiments spacing S2 is greater than thickness T1, the difference (S2−T1) may be smaller than about 5 µm at melting point, for example. Accordingly, during the subsequent thermal process such as the reflow of solder bumps, package substrate 30 is limited in the Z direction, which is the direction perpendicular to major surface 30A of package substrate 30. Package substrate 30, however, can still expand or contract in the X and Y directions, which are parallel to major surface 30A of package substrate 30.

In an embodiment, spacers 44 and package substrate 30 have different coefficients of thermal expansion (CTEs), and the CTE of spacers 44 may be greater than or smaller than the CTE of package substrate 30. In an exemplary embodiment, the CTE of package substrate 30 is between about 8 and about 12, while the CTE of spacers 44 is between about 15 and about 20.

Figure 5:
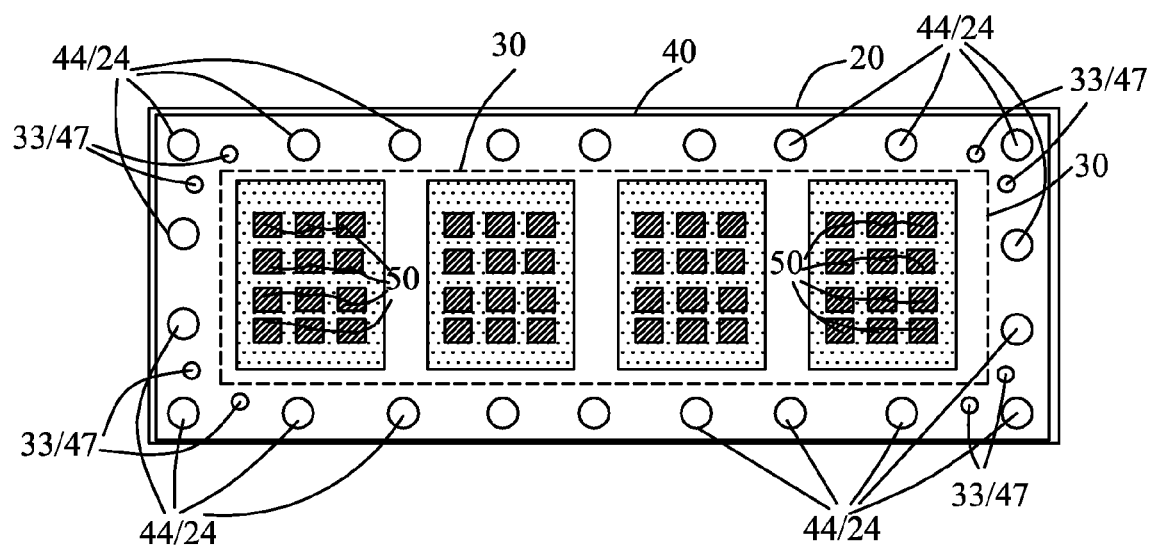

Next, as shown in FIG. 5, dies 50 are placed on package substrate 30. In an exemplary embodiment, each of dies 50 may be attached to one of die-attach regions 32, and metal bumps 36 (FIG. 2B) may join the metal bumps (not shown) in dies 50. The resulting structure may then go through a reflow process. After the reflow, a flux clean process may be performed to clean the flux used for the reflow process. Next, an underfill (not shown) may be dispensed into the spaces between dies 50 and package substrate 30. The result structure may then be sent into an oven for the curing of the underfill. During the reflow, lower jig 20, package substrate 30, and upper jig 40 expand when the temperature increases in the heating stage of the reflow process, and contract when the temperature reduces during the cooling stage of the reflow process.

Since package substrate 30 may have a CTE different from the CTEs of lower jig 20 and upper jig 40, the expansion rates of package substrate 30, lower jig 20, and upper jig 40 may be different. Since spacing S2 (FIG. 4B) is substantially equal to thickness T1 of package substrate 30, package substrate 30 may be allowed to expand and/or contract in the directions parallel to major surface 30A (FIG. 4B) of package substrate 30 substantially freely. The movement of package substrate 30 in the direction (Z direction) perpendicular to major surface 30A is limited by upper jig 40 and lower jig 20. As a result, during and after the reflow process, the warpage of package substrate 30 is at least reduced, and possibly substantially eliminated. In an embodiment, the CTE of spacers 44 is greater than the CTE of package substrate 30, so that at high temperatures, spacing S2 (FIG. 4B) increases more than the increment in thickness T1, and hence package substrate 30 have more room to move freely at high temperatures. Conversely, the CTE of spacers 44 may be smaller than the CTE of package substrate 30, so that at low temperatures, for example, during the cooling stage of the reflow, spacing S2 (FIG. 4B) decreases less than the reduction in thickness T2, and hence package substrate 30 have more room to move freely at low temperatures.

In accordance with embodiments, a device includes a lower jig and an upper jig, wherein the lower jig and the upper jig are configured to secure a package substrate. The lower jig includes a first base material and a first plurality of features attached to the first base material. The first plurality of features is disposed adjacent to a peripheral of the lower jig. The upper jig includes a second base material and a second plurality of features attached to the second base material. The second plurality of features is disposed adjacent to a peripheral of the upper jig. The first plurality of features is configured to be attracted to the second plurality of features by a magnetic force.

In accordance with other embodiments, a device includes a lower jig and an upper jig over the lower jig. The lower jig includes a first base material and a plurality of magnets in the first base material. The plurality of magnets is disposed adjacent to a peripheral of the lower jig. The upper jig includes a second base material and a plurality of ferromagnetic spacers attached to the second base material, wherein the plurality of ferromagnetic spacers spaces the first base material apart from the second base material. The plurality of ferromagnetic spacers is disposed adjacent to a peripheral of the upper jig. Each of the plurality of ferromagnetic spacers is over and vertically aligned to, and attracted to, one of the plurality of magnets.

In accordance with yet other embodiments, a method includes placing a package substrate over a lower jig, and placing an upper jig over the package substrate and the lower jig, wherein portions of the package substrate are exposed through openings in the upper jig. A plurality of first features in the upper jig is aligned to, and is attracted to, a plurality of second features in the lower jig through a magnetic force.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a lower jig comprising:
      a first base material; and
      a first plurality of features attached to the first base material, wherein the first plurality of features is disposed adjacent to a peripheral of the lower jig; and
   an upper jig, wherein the upper jig and the lower jig are configured to secure a package substrate, and wherein the upper jig comprises:
      a second base material; and
      a second plurality of features attached to the second base material, wherein the second plurality of features is disposed adjacent to a peripheral of the upper jig, and wherein the first plurality of features is configured to be attracted to the second plurality of features by a magnetic force.

2. The device of claim 1, wherein the upper jig is disposed over the lower jig, wherein positions of the first plurality of features and positions of the second plurality of features have a one-to-one correspondence, with each of the first plurality of features over and vertically aligned to, and attracted to, one of the second plurality of features.

3. The device of claim 1, wherein the second plurality of features of the upper jig is interconnected to form a ring, and wherein the second plurality of features is configured to leave a space between the upper jig and the lower jig when the upper jig is stacked on the lower jig.

4. The device of claim 1, wherein the upper jig is of a mesh-type comprising a mesh structure.

5. The device of claim 1 further comprising a package substrate between, and secured by, the upper jig and the lower jig, wherein the first and the second features are aligned to a ring encircling the package substrate, and wherein portions of the package substrate are exposed through openings in the upper jig.

6. The device of claim 5, wherein the package substrate has a thickness substantially equal to a spacing between the upper jig and the lower jig.

7. The device of claim 1, wherein the first plurality of features is magnets, and wherein the second plurality of features is formed of a ferromagnetic material.

8. The device of claim 1, wherein the upper jig is disposed over the lower jig, and wherein each of the second plurality of features comprises:
   a stopper portion under the second base material, wherein the stopper portion has a first lateral size; and
   a pin portion inserted into an opening in the second base material, wherein the pin portion and the opening have second lateral sizes smaller than the first lateral size.

9. The device of claim 1, wherein the upper jig is disposed over the lower jig, and wherein each of the second plurality of features comprises a screw portion in the second base material.

10. The device of claim 1, wherein the upper jig comprises a plurality of guide pin holes, and the lower jig comprises a plurality of guide pins aligned to positions of, and configured to be inserted into, the plurality of guide pin holes.

11. A device comprising:
    a lower jig comprising:
       a first base material; and a plurality of magnets in the first base material, wherein the plurality of magnets is disposed adjacent to a peripheral of the lower jig; and an upper jig over the lower jig, wherein the upper jig comprises:
 a second base material; and
 a plurality of ferromagnetic spacers attached to the second base material, wherein the plurality of ferromagnetic spacers spaces the first base material apart from the second base material, wherein the plurality of ferromagnetic spacers is disposed adjacent to a peripheral of the upper jig, and wherein each of the plurality of ferromagnetic spacers is over and vertically aligned to, and attracted to, one of the plurality of magnets.

12. The device of claim 11 further comprising a package substrate between the upper jig and the lower jig, wherein the plurality of ferromagnetic spacers and the plurality of magnets are aligned to a ring encircling the package substrate.

13. The device of claim 12, wherein the plurality of ferromagnetic spacers has a first coefficient of thermal expansion (CTE) greater than a second CTE of the package substrate.

14. The device of claim 12, wherein the package substrate has a thickness substantially equal to a spacing between the upper jig and the lower jig.

15. The device of claim 11, wherein the upper jig is disposed over the lower jig, and wherein each of the plurality of magnets comprises:
 a stopper portion under the second base material, wherein the stopper portion has a first lateral size; and
 a pin portion inserted into an opening in the second base material, wherein the pin portion and the opening have second lateral sizes smaller than the first lateral size.

16. A method comprising:
placing a package substrate over a lower jig; and
placing an upper jig over the package substrate and the lower jig, wherein portions of the package substrate are exposed through openings in the upper jig, and wherein a plurality of first features in the upper jig is aligned to, and is attracted to, a plurality of second features in the lower jig through a magnetic force.

17. The method of claim 16 further comprising:
after the step of placing the upper jig, placing a die over a die-attach region of the package substrate; and
performing a reflow step to bond the die to the package substrate, wherein during the reflow step, the package substrate is located between the upper jig and the lower jig.

18. The method of claim 17, wherein during the reflow step, the upper jig and the lower jig are configured to allow the package substrate to expand and contract in directions parallel to a major surface of the package substrate, and wherein the upper jig and the lower jig are configured to limit a movement of the package substrate in a direction perpendicular to the major surface of the package substrate.

19. The method of claim 16, wherein after the step of placing the upper jig, the upper jig is spaced apart from the lower jig by spacers of the upper jig, and wherein the spacers are configured to space the upper jig from the lower jig apart by a spacing substantially equal to a thickness of the package substrate.

20. The method of claim 16, wherein the plurality of first features is magnets, and the plurality of second features comprises magnetic materials.

* * * * *